(12) United States Patent
He

(10) Patent No.: US 11,445,611 B2
(45) Date of Patent: Sep. 13, 2022

(54) SIGNAL TRANSMISSION APPARATUS AND DISPLAY APPARATUS

(71) Applicant: HKC CORPORATION LIMITED, Shenzen (CN)

(72) Inventor: Huailiang He, Shenzen (CN)

(73) Assignee: HKC CORPORATION LIMITED, Shenzen (CN)

( * ) Notice: Subject to any disclaimer, the term of this patent is extended or adjusted under 35 U.S.C. 154(b) by 162 days.

(21) Appl. No.: 16/759,699

(22) PCT Filed: Nov. 15, 2017

(86) PCT No.: PCT/CN2017/111207
§ 371 (c)(1),
(2) Date: Apr. 27, 2020

(87) PCT Pub. No.: WO2019/080209
PCT Pub. Date: May 2, 2019

(65) Prior Publication Data
US 2020/0305281 A1    Sep. 24, 2020

(30) Foreign Application Priority Data
Oct. 26, 2017    (CN) .......................... 201711022847.X

(51) Int. Cl.
*H05K 1/14*    (2006.01)
*H05K 1/11*    (2006.01)
(Continued)

(52) U.S. Cl.
CPC ........... *H05K 1/147* (2013.01); *H05K 1/0393* (2013.01); *H05K 1/115* (2013.01); *H05K 3/4038* (2013.01);
(Continued)

(58) Field of Classification Search
CPC ................. H05K 1/147; H05K 1/0393; H05K 1/115142; H05K 1/144; H05K 3/4038;
(Continued)

(56) References Cited

U.S. PATENT DOCUMENTS 5,387,493 A  *  2/1995  Imabayashi ............. G03F 7/028
                                                            430/280.1
2002/0134584 A1* 9/2002  Higuchi ............... H05K 3/4635
                                                            174/264
(Continued)

FOREIGN PATENT DOCUMENTS

CN          101448361 A      6/2009
CN          101600291 A      12/2009
(Continued)

OTHER PUBLICATIONS

International Search Report issued for the corresponding international application No. PCT/CN2017/111207, dated Jul. 20, 2018, 4 pages (English Translation).

*Primary Examiner* — Roshn K Varghese
(74) *Attorney, Agent, or Firm* — Snyder, Clark, Lesch & Chung, LLP

(57) ABSTRACT

The present disclosure illustrates a signal transmission device and a display device using the same. The signal transmission device includes a first flexible printed circuit board comprising a first circuit layer and a connection member, wherein the first circuit layer is electrically connected to a display module and a system; a second flexible printed circuit board disposed on the first flexible printed circuit board, and comprising a second circuit layer; a third flexible printed circuit board disposed on the first flexible printed circuit board, and comprising a third circuit layer; insulating layers disposed between the first, second and third flexible printed circuit boards, and comprising a plurality of through holes formed thereon in a vertical direction; and (Continued)

conductive pillars disposed in the through holes, respectively, wherein the second and third circuit layer are electrically connected to the system through the first circuit layer and the conductive pillars.

17 Claims, 7 Drawing Sheets

(51) Int. Cl.
*H05K 1/03* (2006.01)
*H05K 3/40* (2006.01)
*G02F 1/1333* (2006.01)

(52) U.S. Cl.
CPC .. *G02F 1/13338* (2013.01); *H05K 2201/0145* (2013.01); *H05K 2201/0154* (2013.01); *H05K 2201/10136* (2013.01)

(58) Field of Classification Search
CPC ... H05K 2201/0145; H05K 2201/0154; H05K 2201/10136; H05K 1/181; H05K 1/189; H05K 3/3431; H05K 3/361; G02F 1/13338; G02F 1/13452; G02F 1/1303; G06F 3/041; G06F 1/183; G06F 1/1637; G06F 1/1643; H01R 12/78

See application file for complete search history.

(56) References Cited

U.S. PATENT DOCUMENTS

| | | | | |
|---|---|---|---|---|
| 2003/0098179 | A1* | 5/2003 | Obata | H05K 3/4614 |
| | | | | 174/262 |
| 2018/0068992 | A1* | 3/2018 | Oh | H01L 25/18 |
| 2018/0184523 | A1* | 6/2018 | Yoo | H05K 1/147 |

FOREIGN PATENT DOCUMENTS

| | | |
|---|---|---|
| CN | 102340937 A | 2/2012 |
| CN | 103152979 A | 6/2013 |
| CN | 103188869 | 7/2013 |
| JP | H10150277 | 6/1998 |

* cited by examiner

SIGNAL TRANSMISSION APPARATUS AND DISPLAY APPARATUS

CROSS-REFERENCE TO RELATED APPLICATION

This application is a National Stage Application of PCT International Patent Application No. PCT/CN2017/111207 filed on Nov. 15, 2017, under 35 U.S.C. § 371, which claims priority to and the benefit of Chinese Patent Application No. 201711022847.X, filed on Oct. 26, 2017, and the disclosures of which are incorporated herein in their entirety by reference.

BACKGROUND

1. Field

The present disclosure relates to a signal transmission device, and more particularly to a signal transmission device including a plurality of printed circuit boards, and a display device using the signal transmission device.

2. Description of the Related Art

In general, a liquid crystal display device with a touch control function (hereafter refer to as a touch control liquid crystal device) includes a system, a LCD panel, a touch panel and a light source. In a structure of a typical touch control liquid crystal device, the signals of the LCD panel, the touch panel and the light source are transmitted through different flexible printed circuit boards. However, in order to transmit the signals to the system through the flexible printed circuit boards, the signals must be through three ports electrically connected to the system, so that the system must have larger space for the plurality of ports, and reduction of the size of the device is limited.

Furthermore, in related art, the soldering manner is used to solder and electrically connect the plurality of flexible printed circuit boards to the same flexible printed circuit board, so as to collect the signals first and transmit the collected signal to the system. As a result, the system just needs to have the space for one port, thereby solving above problem.

However, the soldering process may have variation, for example, the mechanical soldering process may be affected by environmental factor easily, and the manual soldering process is hard to control the soldering quality. Therefore, what is needed is to develop a signal transmission device to solve above problems.

SUMMARY

An objective of the present disclosure is to provide a signal transmission device, to solve the problem of limitation in size reduction of the device and variation during the soldering process.

An objective of the present disclosure is to provide a display device, to solve the problem of limitation in size reduction of the device and variation during the soldering process.

According to an embodiment, the present disclosure provides a signal transmission device comprising: a first flexible printed circuit board comprising a first circuit layer and a connection member, wherein the first circuit layer is electrically connected to a display module and a system; a second flexible printed circuit board disposed on the first flexible printed circuit board, and comprising a second circuit layer, wherein the second circuit layer is electrically connected to the display module and the first flexible printed circuit board; a third flexible printed circuit board disposed on the first flexible printed circuit board, and comprising a third circuit layer, wherein the third circuit layer is electrically connected to the display module and the first printed circuit board; a plurality of insulating layers disposed between the first flexible printed circuit board, the second printed circuit board, and the third flexible printed circuit board, and comprising a plurality of through holes formed thereon in a vertical direction; and a plurality of conductive pillars disposed in the plurality of through holes, respectively, wherein the second circuit layer and the third circuit layer are electrically connected to the system through the first circuit layer and the plurality of conductive pillars.

Optionally, material of the insulating layer is polyimide.

Optionally, material of the insulating layer is polyethylene terephthalate.

Optionally, material of the insulating layer is polyethylene naphthalate.

The signal transmission device according to claim 1, wherein material of the conductive pillar is conductive adhesive.

Optionally, the second flexible printed circuit board and the third flexible printed circuit board are disposed on the same plane.

Optionally, the third flexible printed circuit board is disposes on the second flexible printed circuit board.

According to an embodiment, the present disclosure provides a signal transmission device comprising: an insulation substrate; a connection member disposed on the insulation substrate and electrically connected to the system; a first conductive pattern disposed on the insulation substrate, and electrically connected to the display module and the connection member; a second conductive pattern disposed on the first conductive pattern, and electrically connected to the display module and the first conductive pattern; a third conductive pattern disposed on the second conductive pattern, and electrically connected to the display module and the second conductive pattern; insulation layers disposed between the first conductive pattern, the second conductive pattern and the third conductive pattern, respectively, and configured to insulate and attach the first conductive pattern, the second conductive pattern and the third conductive pattern; an interlayer conduction structure disposed in the insulation layers, wherein the second conductive pattern and the third conductive pattern are electrically connected to the system through the first conductive pattern through the interlayer conduction structure.

Optionally, the interlayer conduction structure comprises through hole formed in the insulation layer in vertical direction.

Optionally, an inner wall of the through hole is coated with conductive layer.

Optionally, the insulating layer and the first conductive pattern and the second conductive pattern are attached with each other by solidifying prepolymer solution.

According to an embodiment, the present disclosure provides a manufacturing method of a signal transmission device, and the method comprises steps of disposing an insulation substrate; disposing a connection member on the insulation substrate, and electrically connecting the connection member and a system; disposing a first conductive pattern on the insulation substrate, and electrically connecting the first conductive pattern and the display module and the connection member; disposing a second conductive pattern on the first conductive pattern, and electrically connecting the second conductive pattern, the display module and the first conductive pattern; disposing a third conductive pattern on the second conductive pattern, and electrically connecting the third conductive pattern, the display module and the second conductive pattern; disposing an insulating layers between the first conductive pattern, the second conductive pattern and the third conductive pattern, to insulating and attaching the first conductive pattern, the second conductive pattern and the third conductive pattern; and disposing an interlayer conduction structure, wherein the interlayer conduction structure comprises: disposing through holes on the insulating layer in a vertical direction; and coating conductive layers on inner walls of the through holes; wherein the conductive layers are electrically connected to at least one of the first conductive pattern, the second conductive pattern and the third conductive pattern, so that the second conductive pattern and the third conductive pattern are electrically connected to the system through the first conductive pattern.

According to an embodiment, the present disclosure provides a display device comprising a display module and a system. The display module and the system are electrically connected through a signal transmission device, and the signal transmission device comprises: a first flexible printed circuit board comprising a first circuit layer and a connection member, wherein the first circuit layer is electrically connected to the display module and the system through the connection member; a second flexible printed circuit board disposed on the first flexible printed circuit board and comprising a second circuit layer, wherein the second circuit layer is electrically connected to the display module and the first flexible printed circuit board; a third flexible printed circuit board disposed on the first flexible printed circuit board, and comprising a third circuit layer, wherein the third circuit layer is electrically connected to the display module and the first printed circuit board; a plurality of insulating layers disposed between the first flexible printed circuit board, the second printed circuit board, and the third flexible printed circuit board, and disposed under the first printed circuit board, and comprising a plurality of through holes formed thereon in a vertical direction; a plurality of conductive pillars disposed in the plurality of through holes, respectively, wherein the second circuit layer and the third circuit layer are electrically connected to the system through the first circuit layer and the plurality of conductive pillars.

Optionally, material of the insulating layer is polyimide.

Optionally, material of the insulating layer is polyethylene terephthalate.

Optionally, material of the insulating layer is polyethylene terephthalate.

Optionally, material of the conductive pillar is conductive adhesive.

Optionally, the third flexible printed circuit board and the second flexible printed circuit board are disposed d on the same plane.

Optionally, the third flexible printed circuit board is disposed on the second flexible printed circuit board.

According to an embodiment, the present disclosure provides a display device comprising a display module and a system. The display module and the system are electrically connected to each other through a signal transmission device, and the signal transmission device comprises: a first flexible printed circuit board comprising a first circuit layer and a connection member, wherein the first circuit layer is electrically connected to the display module and the system through the connection member; a second flexible printed circuit board disposed on the first flexible printed circuit board and comprising a second circuit layer, wherein the second circuit layer is electrically connected to the display module and the first flexible printed circuit board; a third flexible printed circuit board disposed on the first flexible printed circuit board, and comprising a circuit layer, wherein the third flexible printed circuit board and the second flexible printed circuit board are disposed on the same plane, and the third circuit layer is electrically connected to the display module and the first printed circuit board; a plurality of insulating layers made by material selected from the group consisting of polyimide, polyethylene terephthalate, polyethylene naphthalate, and disposed between the first flexible printed circuit board, the second flexible printed circuit board, and the third flexible printed circuit board, and disposed under the first printed circuit board, wherein the plurality of insulating layers comprise a plurality of through holes in a vertical direction; and a plurality of conductive pillars disposed in the plurality of through holes, respectively, wherein the second circuit layer and the third circuit layer are electrically connected to the system through the first circuit layer and the plurality of conductive pillars.

The present disclosure provides the signal transmission device to replace the conventional manner of soldering multiple circuit boards for connection, so as to prevent the variation during the soldering process, and reduce errors of the manufacturing process, and improve yield rate of the display product. Furthermore, compared with the soldering manner, the signal transmission device of the present disclosure can improve connection strength between multiple circuit boards.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

Figure 1:
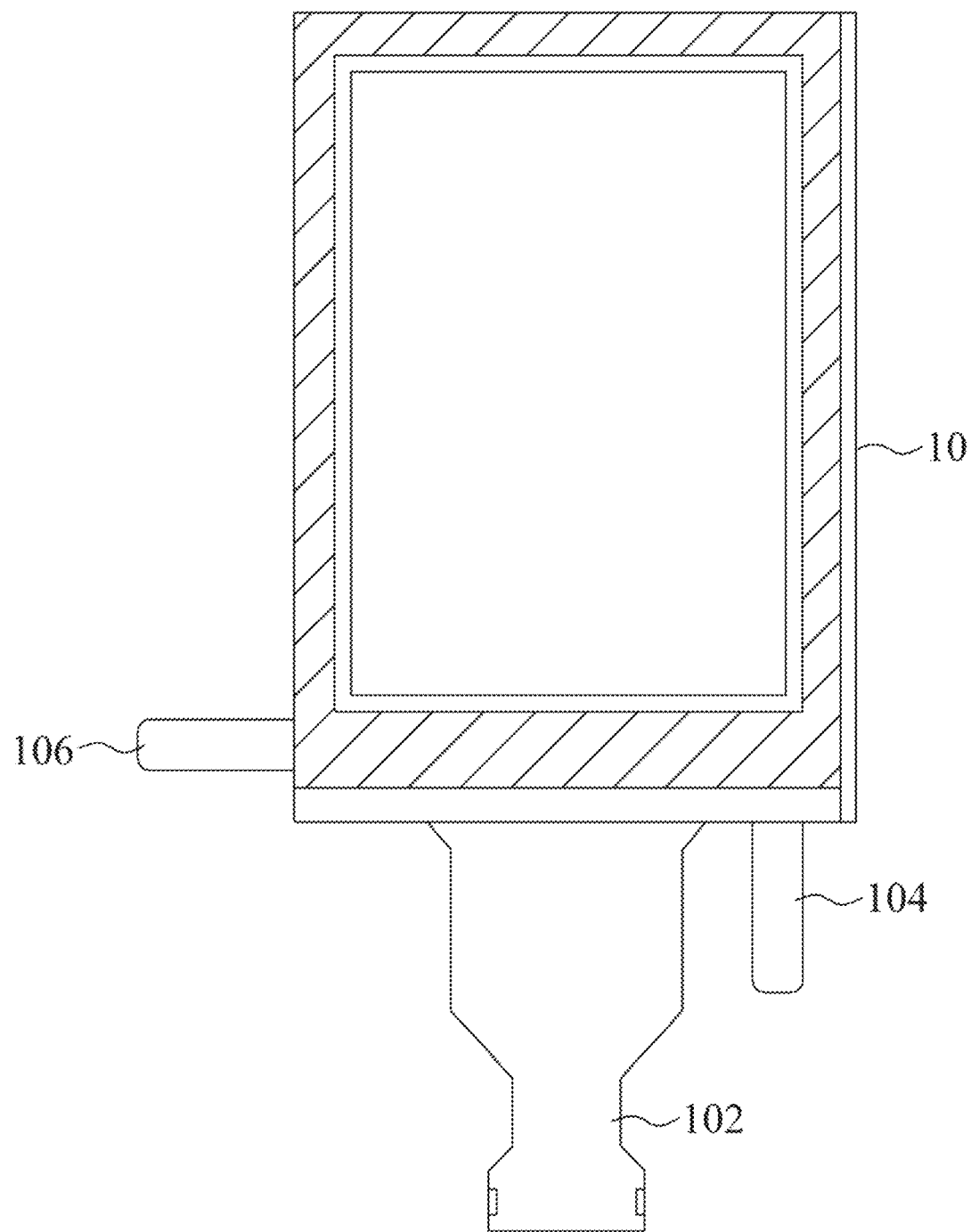
FIG. 1 is a schematic structural view of an example of a liquid crystal touch control device.

The following embodiments of the present disclosure are herein described in detail with reference to the accompanying drawings. These drawings show specific examples of the embodiments of the present disclosure. It is to be understood that these embodiments are exemplary implementations and are not to be construed as limiting the scope of the present disclosure in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

As shown in FIG. 1, the signals of a touch panel, a light source, and a LCD panel are transmitted through the flexible printed circuit boards 102, 104 and 106 in the display module 10. However, when the signals are transmitted through the flexible printed circuit boards and the flexible printed circuit boards are electrically connected to three ports respectively, it means that the system must has a larger space for the plurality of ports, and reduction of the size of the device is limited.

Figure 2:
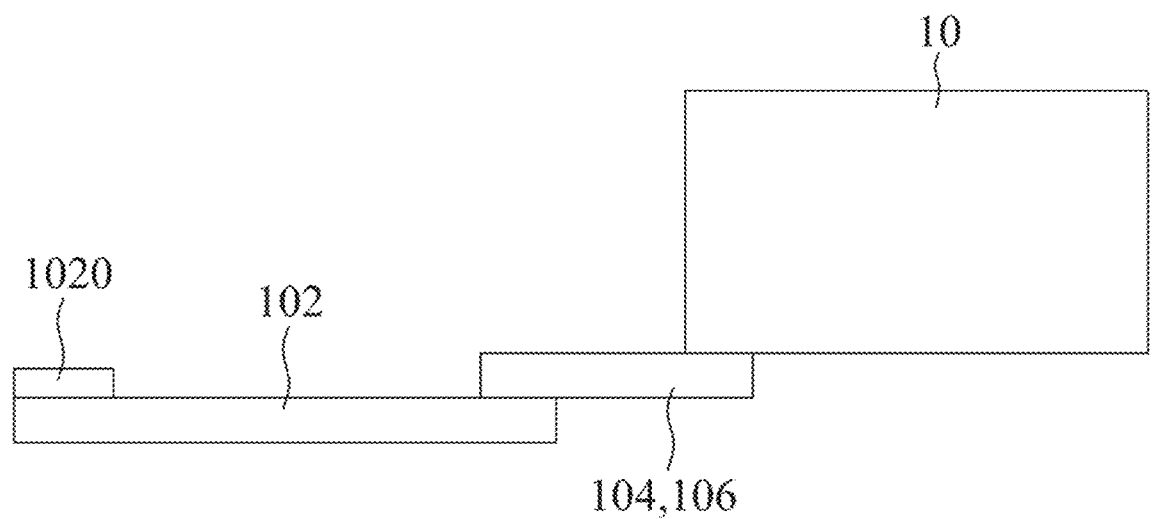
FIG. 2 is a structural side view of the liquid crystal touch control device.

Please refer to FIG. 2. By using the soldering manner, the flexible printed circuit boards 104 and 106 are soldered to the flexible printed circuit board 102 for electrically connection, and after the signals are collected in the flexible printed circuit board 102, the collected signals are transmitted to the system through the connection terminal 1020. The system just needs to have the space for one port, thereby solving above problem.

Figure 3:
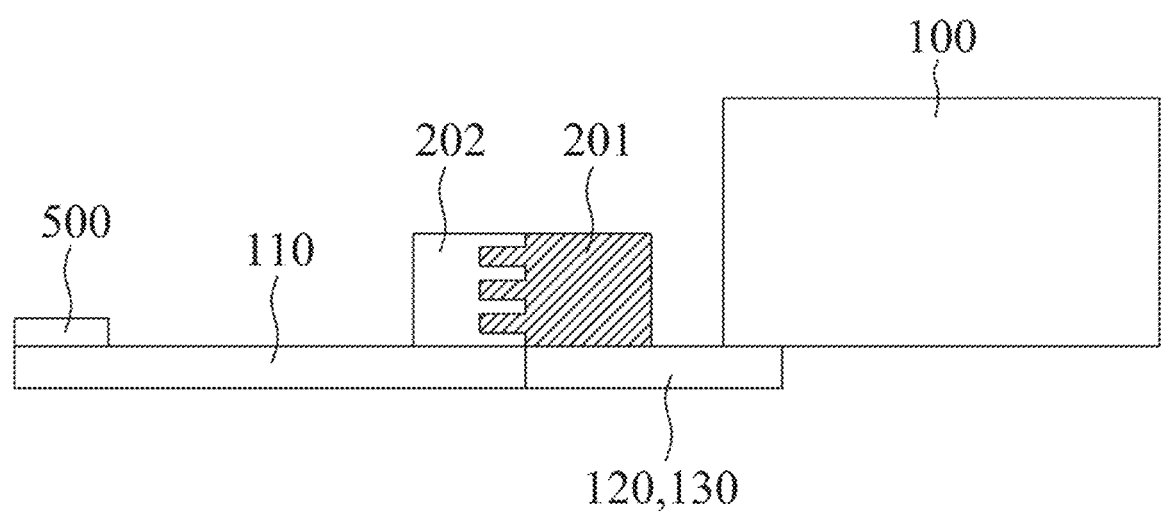
FIG. 3 is a structural side view of a display device of an embodiment of the present disclosure.

In an embodiment, as shown in FIG. 3, a signal transmission device comprises a first flexible printed circuit board 110 and a second flexible printed circuit board 120. The first flexible printed circuit board 110 can be electrically connected to the display module 100 and the system (not shown in figures), and the first flexible printed circuit board 110 includes a port 202 disposed thereon. The ports 202 is electrically connected to the circuits of the first flexible printed circuit board 110, so that other components can be electrically connected to the first flexible printed circuit board 110 through the port 202. The second flexible printed circuit board 120 is electrically connected to the display module 100 and comprises a port connection member 201. The port connection member 201 is electrically connected to the circuits of the second flexible printed circuit board 120, so that other components can be electrically connected to the first flexible printed circuit board 110 through the port 202. The port connection members 201 and the port 202 corresponds to each other, and can be fixed together or detached from each other upon demand. The port connection member 201 can be inserted, engaged or connected to the port 202 by using spring clip, tenon, or other manner.

In above embodiment, the port 202 can be single or multiple, and can be disposed at any side of the first flexible printed circuit board 110. For example, the port 202 can be disposed on an upper surface, a lower surface, an edge or other possible position of the first flexible printed circuit board 110. The disposal of the port 202 must ensure electrical connection between the port 202 and the first flexible printed circuit board 110, so as to input signal to or output signal from the first flexible printed circuit board 110 through the port 202.

On the other hand, the port connection member 201 can be single or multiple, and can be disposed at any side of the second flexible printed circuit board 120. For example, the port connection member 201 can be disposed on an upper surface, a lower surface, an edge or other possible position of the second flexible printed circuit board 120. The disposal of the port connection member 201 must ensure electrical connection between the port connection member 201 and the second flexible printed circuit board 120, so as to input signal to or output signal from the first flexible printed circuit board 110 through the port connection member 201.

The first flexible printed circuit board 110 can be electrically connected to the second flexible printed circuit board flexible printed circuit board through the port connection member 201 and the port 202. According to the positions of the port connection member 201 and the port 202, the first flexible printed circuit board 110 and the second flexible printed circuit board 120 can disposed in different positions. For example, the first flexible printed circuit board 110 and the second flexible printed circuit board 120 can be disposed on the same plane and adjacent to each other; or, the first flexible printed circuit board 110 and the second flexible printed circuit board 120 can be disposed on different planes; or, the first flexible printed circuit board 110 and the second flexible printed circuit board 120 can be overlapped partially. However, the actual positions of the first flexible printed circuit board 110 and the second flexible printed circuit board 120 are not limited to above examples, and any disposal of the first flexible printed circuit board 110 and the second flexible printed circuit board 120 for electrical connection is within scope of the present disclosure.

In an embodiment, the first flexible printed circuit board 110 can be directly connected to the display module 100, or not directly connected to the display module 100. Under a condition that the first flexible printed circuit board 110 is directly connected to the display module 100, the first flexible printed circuit board 110 can receive the signals from the display module 100 directly; and, under a condition that the first flexible printed circuit board 110 is not directly connected to the display module 100, the first flexible printed circuit board 110 can receive the signals from the display module 100 through the second flexible printed circuit board 120, the port connection member 201 and the port 202 which are electrically connected to the display module 10. Furthermore, the first flexible printed circuit board 110 can include a connection member 500 disposed thereon and configured to electrically connect the system, and the signal can be transmitted to the system through the connection member 500.

The second flexible printed circuit board 120 can be electrically connected to the light source or the touch panel of the display module 100 (not shown in figures), and transmits a light source signal provided by the light source, and/or transmits a touch control signal provided by the touch panel. The second flexible printed circuit board 120 and the first flexible printed circuit board 110 can be disposed on different sides of the display module 100, or, the second flexible printed circuit board 120 and the first flexible printed circuit board 110 can be disposed on the same side of the display module 100.

Optionally, the first flexible printed circuit board 110 and the second flexible printed circuit board 120 are fixed relative to each other through an alignment mark. Optionally, besides the port connection member 201 and the port 202, the first flexible printed circuit board 110 and the second flexible printed circuit board 102 can be connected with each other by other conventional manner after the first flexible printed circuit board 110 and the second flexible printed circuit board 102 are aligned with each other by the alignment mark, so as to fix their relative positions.

Furthermore, the signal transmission device of the present disclosure may include a third flexible printed circuit board 130. The third flexible printed circuit board 130 can have a function equal to that of the second flexible printed circuit board 120. That is, the third flexible printed circuit board 130 can be electrically connected to the light source or the touch panel of the display module 100 (not shown in figures), and configured to transmit the light source signal provided by the light source, and/or transmit the touch control signal provided by the touch panel. Similarly, the third flexible printed circuit board 130 and the first flexible printed circuit board 110 can be disposed on different sides of the display module 100; or, the third flexible printed circuit board 130 and the first flexible printed circuit board 110 can be disposed on the same side of the display module 100. The third flexible printed circuit board 130 and the second flexible printed circuit board 120 can be disposed on different sides of the display module 100, or, the third flexible printed circuit board 130 and the second flexible printed circuit board 120 can be disposed on the same side of the display module 100.

Optionally, the third flexible printed circuit board 130 and the second flexible printed circuit board 120 can transmit different signals, respectively. For example, the third flexible printed circuit board 130 can be electrically connected to the light source of the display module 100 and transmit the light source signal, and the second flexible printed circuit board 120 can be electrically connected to the touch panel of the display module 100 and transmit the touch control signal.

In another embodiment of the present disclosure, the signal transmission device can be disposed in the liquid crystal display device to transmit signals, so as to provide a liquid crystal display device of the present disclosure.

In some embodiments, the above-mentioned components can be optimized to improve advantages of the present disclosure upon actual condition and requirement. The following describes different embodiments.

Figure 4:
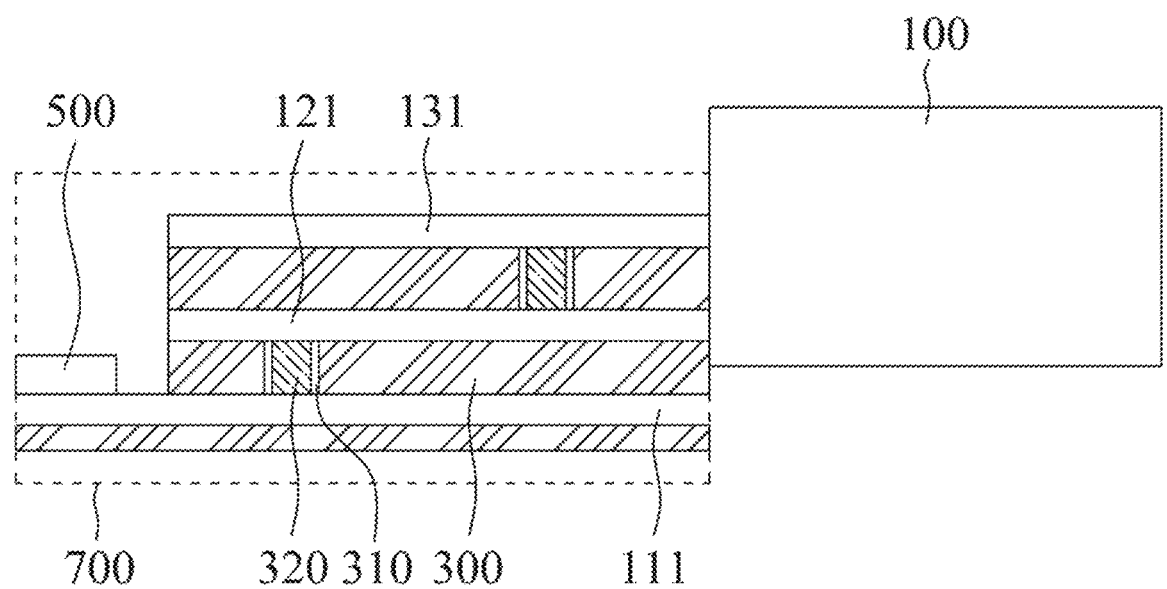
FIG. 4 is a structural side view of a display device of an embodiment of the present disclosure.
Figure 6:
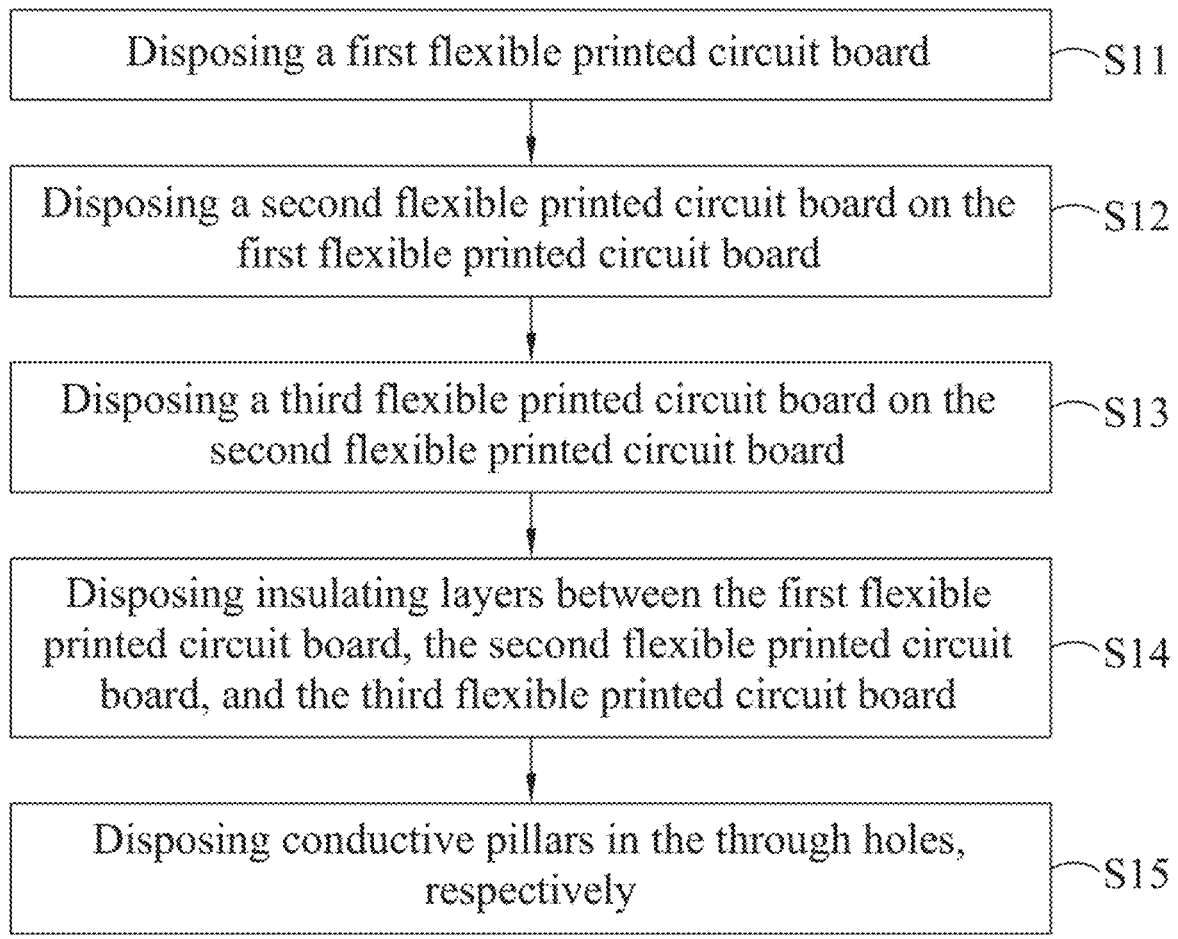
FIG. 6 is a flowchart showing the steps of manufacturing method of the signal transmission device of an embodiment of the present disclosure.

According to an embodiment, the present disclosure provides a composite signal transmission device. To optimize the disposal relationship between the first flexible printed circuit board 110, the second flexible printed circuit board 120 and the third flexible printed circuit board 130 without using the port connection members 201 and the ports 202 to electrically connect the flexible printed circuit boards, the first flexible printed circuit board 110, the second flexible printed circuit board 120 and the third flexible printed circuit board 130 are integrated as a composite signal transmission device 700 with a multi-layer structure. As shown in FIG. 4, the flexible printed circuit boards equivalent to the first flexible printed circuit board 110, the second flexible printed circuit board 120 and the third flexible printed circuit board 130 are denoted as a first flexible printed circuit board 111, a second flexible printed circuit board 121 and a third flexible printed circuit board 131, so as to distinguish this embodiment from aforementioned embodiments. The first flexible printed circuit board 111, the second flexible printed circuit board 121 and the third flexible printed circuit board 131 are overlapped to form the composite signal transmission device 700, and insulation layers 300 are disposed between the first flexible printed circuit board 111, the second flexible printed circuit board 121 and the third flexible printed circuit board 131, to form the multi-layer structure. Preferably, the insulation layer 300 can be formed with a plurality of through holes 310, and a plurality of conductive pillars 320 are disposed in the plurality of through holes 310, respectively, so that the first flexible printed circuit board 111, the second flexible printed circuit board 121 and the third flexible printed circuit board 131 can be separated from and electrically connected to each other. Optionally, the first flexible printed circuit board 110 can be replaced by a hard circuit board. Furthermore, the insulation layer 300 can be disposed under the first flexible printed circuit board 111. The signal transmission device can be manufactured according to a flow shown in FIG. 6, and the descriptions for the steps S11 to S15 is merely for exemplary illustration, and the present disclosure is not limited thereto, and the manufacturing process can be modified upon demand.

For example, the material of the insulation layer 300 can be polyimide (PI), polyethylene terephthalate (PET), polyethylene naphthalate (PEN) or other insulation material known in the art. The material of the conductive pillar 320 can be conductive adhesive, isotropic conductive film, or conductive material known in the art.

For example, the second flexible printed circuit board 121 can be electrically connected to the light source of the display module 100, and the third flexible printed circuit board 131 can be electrically connected to the touch panel of the display module 100. The second flexible printed circuit board 121 and the third flexible printed circuit board 131 can be electrically connected to the first flexible printed circuit board 111 through the conductive pillars 320 in the through holes 310, and then electrically connected to the system through the connection member 500. However, above-mentioned description is merely for exemplary illustration, and the actual disposal of the printed circuit boards can be adjusted upon demand. For example, the second flexible printed circuit board 121 and the third flexible printed circuit board 131 can be disposed on the same plane of the first flexible printed circuit board 111, and electrically connected to the first flexible printed circuit board 111 by above-mentioned manner.

Figure 5:
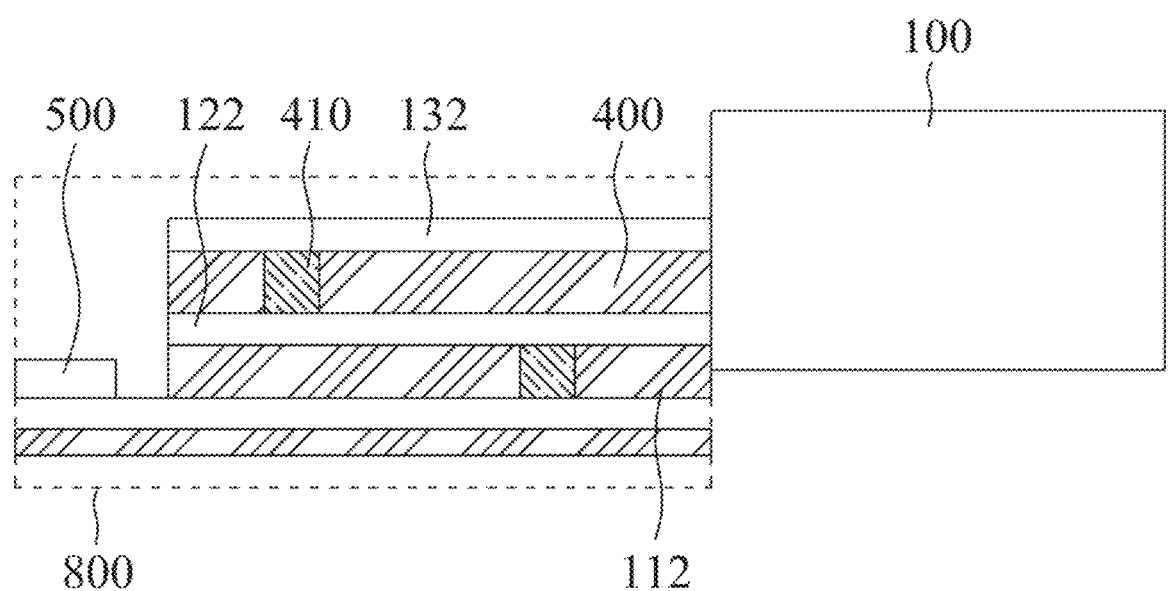
FIG. 5 is a structural side view of display device of an embodiment of the present disclosure.

Similarly, in another embodiment, the disposal relationships between the first flexible printed circuit board 110, the second flexible printed circuit board 120 and the third flexible printed circuit board 130 can be optimized. The first flexible printed circuit board 110, the second flexible printed circuit board 120 and the third flexible printed circuit board 130 are integrated as a composite flexible printed circuit board with a multi-layer structure similar to previous embodiment, so as to form a compact composite signal transmission device 800, as shown in FIG. 5. In FIG. 5, the compact composite signal transmission device 800 includes a first conductive pattern 112, a second conductive pattern 122, and a third conductive pattern 132 equivalent to circuits on the first flexible printed circuit board 110, the second flexible printed circuit board 120 and the third flexible printed circuit board 130, respectively. The first conductive pattern 112 can be disposed on any insulation substrate (not shown in figures), and the insulation substrate includes a conductive part 500 disposed thereon and electrically connected to the above-mentioned structures.

Figure 7:
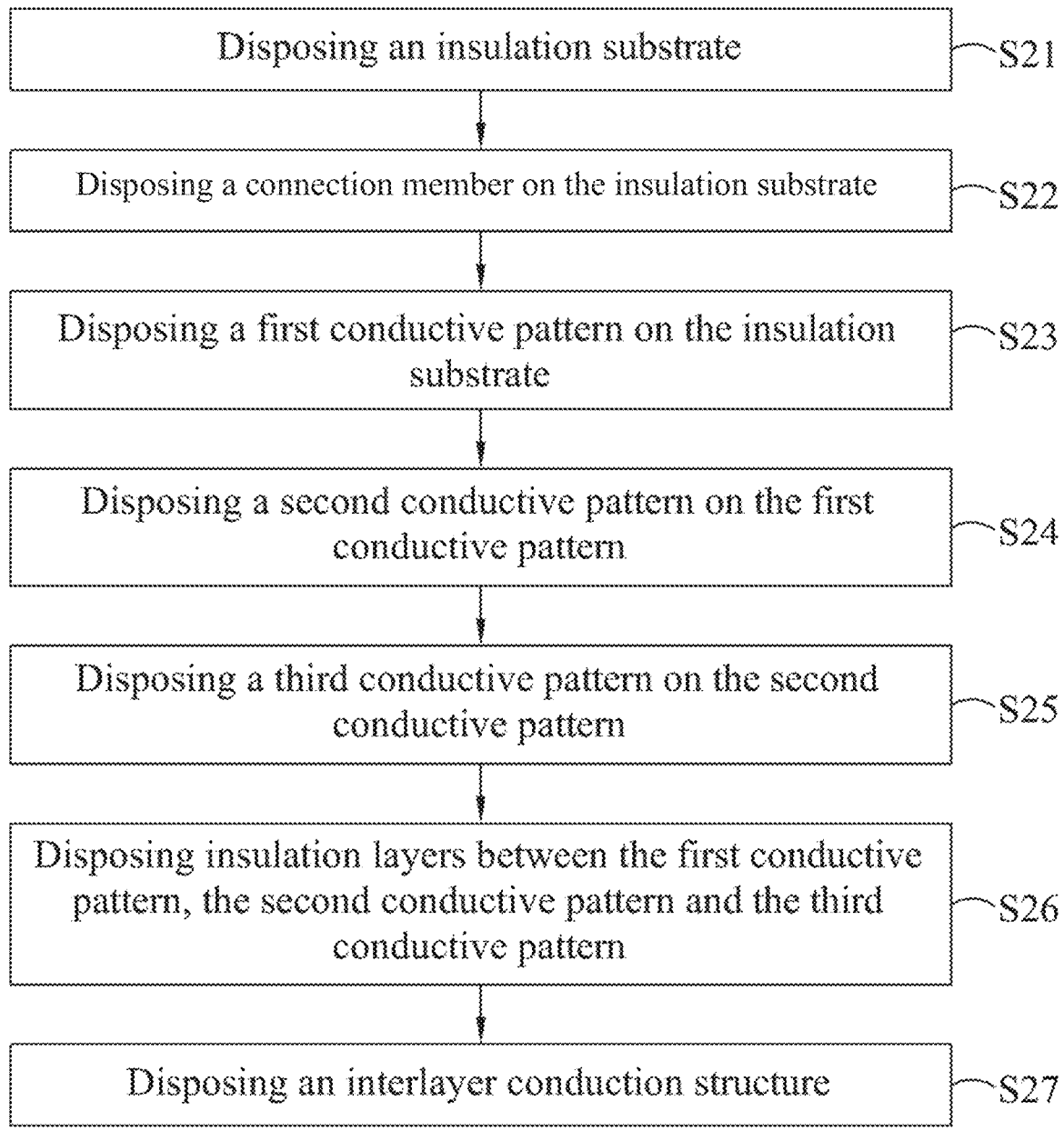
FIG. 7 is a flowchart showing the steps of manufacturing method of the signal transmission device of other embodiment of the present disclosure.

A plurality of insulating layers 400 are disposed under a bottom of the compact composite signal transmission device 800, and disposed between the first conductive pattern 112, the second conductive pattern 122 and the third conductive pattern 132, respectively. The interlayer conduction structure 410 is disposed between the first conductive pattern 112, the second conductive pattern 122 and the third conductive pattern 132, so that the first conductive pattern 112, the second conductive pattern 122 and the third conductive pattern 132 can be electrically connected to each other through the interlayer conduction structure 410. In order to form the interlayer conduction structure 410, the insulation layer 400 can be formed with at least one through hole, and an inner wall of the through hole can be coated with conductive layer by chemical and plating process. The material of the coating layer can be metal or conductive plastic, or other conductive material. The coating layer is electrically connected to conductive patterns over and under the interlayer conduction structure, so as to electrically connect to the conductive patterns. The signal transmission device with the insulating layers 400 can be manufactured according to a flow shown in FIG. 7, and the descriptions for the steps S21 to S27 are merely for exemplary illustration, and the present disclosure is not limited thereto, and the manufacturing process can be modified upon demand.

The different between the compact composite signal transmission device 800 and the composite signal transmission device 700 of previous embodiment is that the first conductive pattern 112, the second conductive pattern 122 and the third conductive pattern 132 are formed by copper foil stamping manner. The first conductive pattern 112, the second conductive pattern 122 and the third conductive pattern 132 are much thinner than the first flexible printed circuit board 111, the second flexible printed circuit board 121 and the third flexible printed circuit board 131, so that the entire thickness of the compact composite signal transmission device 800 can be lower than that of the composite signal transmission device 700.

Furthermore, the insulation layer 400 of the compact composite signal transmission device 800 can be made by single material, but the insulation layer 400 has two states during the forming process, one of the two states is solid insulation layer, and the other is liquid insulation layer before solidification. Preferably, the material of the insulation layer 400 can be polyimide (PI). The insulation layer 400 is disposed between the first conductive pattern 112, the second conductive pattern 122 and the third conductive pattern 132. The prepolymer solution of the liquid polyimide is coated between the three conductive patterns first. The prepolymer solution is the material of the insulation layer 400 before solidification. Next, the solution is heated to remove the organic solvent in the solution, so as to solidify the material to form the insulation layer 400. The insulation layer 400 has insulation effect and can also be served as assistant adhesive material for the first conductive pattern 112, the second conductive pattern 122 and the third conductive pattern 132, so as to make the structure of the compact composite signal transmission device 800 more stable.

Similarly, in the present disclosure, above-mentioned signal transmission device can be disposed in the liquid crystal display device to transmit signals, so as to provide the liquid crystal display device of the present disclosure having benefits and effects of above-mentioned embodiments. Without affecting the signal transmission of the circuit board, the disposal of the circuit board of the liquid crystal display device can be changed to reduce the ports electrically connected to the system, thereby omitting the soldering process having higher variation, and reducing errors and increasing product yield.

According to an embodiment, the present disclosure provides a signal transmission device comprising: a first flexible printed circuit board comprising a first circuit layer and a connection member, wherein the first circuit layer is electrically connected to a display module and a system; a second flexible printed circuit board disposed on the first flexible printed circuit board, and comprising a second circuit layer, wherein the second circuit layer is electrically connected to the display module and the first flexible printed circuit board; a third flexible printed circuit board disposed on the first flexible printed circuit board, and comprising a third circuit layer, wherein the third circuit layer is electrically connected to the display module and the first printed circuit board; a plurality of insulating layers disposed between the first flexible printed circuit board, the second printed circuit board, and the third flexible printed circuit board, and comprising a plurality of through holes formed thereon in a vertical direction; and a plurality of conductive pillars disposed in the plurality of through holes, respectively, wherein the second circuit layer and the third circuit layer are electrically connected to the system through the first circuit layer and the plurality of conductive pillars.

Besides the display device, the signal transmission device of the present disclosure can also be disposed in other electronic device. Preferably, the signal transmission device can be applied to LCD display device, OLED display device, Q LED display device, curved display device or other display device.

The present disclosure disclosed herein has been described by means of specific embodiments. However, numerous modifications, variations and enhancements can be made thereto by those skilled in the art without departing from the spirit and scope of the disclosure set forth in the claims.

What is claimed is:

1. A signal transmission device, comprising:
a first flexible printed circuit board comprising a first circuit layer and a connection member, wherein the first circuit layer is electrically connected to a display module and a system;
a second flexible printed circuit board disposed on the first flexible printed circuit board, and comprising a second circuit layer, wherein the second circuit layer is electrically connected to the display module and the first flexible printed circuit board;
a third flexible printed circuit board disposed on the first flexible printed circuit board, and comprising a third circuit layer, wherein the third circuit layer is electrically connected to the display module and the first flexible printed circuit board;
a plurality of insulating layers disposed between the first flexible printed circuit board, the second flexible printed circuit board, and the third flexible printed circuit board, and comprising a plurality of through holes formed thereon in a vertical direction; and
a plurality of conductive pillars disposed in the plurality of through holes, respectively, wherein the second circuit layer and the third circuit layer are electrically connected to the system through the first circuit layer and the plurality of conductive pillars;
wherein the second circuit layer and the third circuit layer are both in direct connection with the display module, and signals on the third circuit layer are transmitted through the second circuit layer and then the first circuit layer via the plurality of conductive pillars in order to establish communication between the display module and the system.

2. The signal transmission device according to claim 1, wherein material of the insulating layer is selected from the group consisting of polyimide, polyethylene terephthalate, polyethylene naphthalate.

3. The signal transmission device according to claim 1, wherein material of the conductive pillar is conductive adhesive.

4. The signal transmission device according to claim 1, wherein the second flexible printed circuit board and the third flexible printed circuit board are disposed on the same plane.

5. The signal transmission device according to claim 1, wherein the third flexible printed circuit board is disposed on the second flexible printed circuit board.

6. A signal transmission device, comprising:
an insulation substrate;
a connection member disposed on the insulation substrate and electrically connected to a system;
a first conductive pattern disposed on the insulation substrate, and electrically connected to a display module and the connection member;
a second conductive pattern disposed on the first conductive pattern, and electrically connected to the display module and the first conductive pattern;
a third conductive pattern disposed on the second conductive pattern, and electrically connected to the display module and the second conductive pattern;
a plurality of insulation layers disposed between the first conductive pattern, the second conductive pattern and the third conductive pattern, respectively, and configured to insulate and attach the first conductive pattern, the second conductive pattern and the third conductive pattern;
an interlayer conduction structure disposed in the insulation layers, wherein the second conductive pattern and the third conductive pattern are electrically connected to the system through the first conductive pattern through the interlayer conduction structure;
wherein the second conductive pattern and the third conductive pattern are both in direct connection with the display module, and signals on the third conductive pattern are transmitted through the second conductive pattern and then the first conductive pattern via the interlayer conduction structure in order to establish communication between the display module and the system.

7. The signal transmission device according to claim 6, wherein the interlayer conduction structure comprises through hole formed in the insulation layer in vertical direction.

8. The signal transmission device according to claim 7, wherein an inner wall of the through hole is coated with conductive layer.

9. The signal transmission device according to claim 8, wherein the insulating layer and the first conductive pattern and the second conductive pattern are attached with each other by solidifying prepolymer solution.

10. A display device, comprising:
a display module;
a system;
wherein the display module and the system are electrically connected through a signal transmission device, and the signal transmission device comprises:
a first flexible printed circuit board comprising a first circuit layer and a connection member, wherein the first circuit layer is electrically connected to the display module and the system through the connection member;
a second flexible printed circuit board disposed on the first flexible printed circuit board and comprising a second circuit layer, wherein the second circuit layer is electrically connected to the display module and the first flexible printed circuit board;
a third flexible printed circuit board disposed on the first flexible printed circuit board, and comprising a third circuit layer, wherein the third circuit layer is electrically connected to the display module and the first flexible printed circuit board;
a plurality of insulating layers disposed between the first flexible printed circuit board, the second flexible printed circuit board, and the third flexible printed circuit board, and disposed under the first flexible printed circuit board, and comprising a plurality of through holes formed thereon in a vertical direction;
a plurality of conductive pillars disposed in the plurality of through holes, respectively, wherein the second circuit layer and the third circuit layer are electrically connected to the system through the first circuit layer and the plurality of conductive pillars;
wherein the second circuit layer and the third circuit layer are both in direct connection with the display module, and signals on the third circuit layer are transmitted through the second circuit layer and then the first circuit layer via the plurality of conductive pillars in order to establish communication between the display module and the system.

11. The display device according to claim 10, wherein material of the insulating layer is polyimide.

12. The display device according to claim 10, wherein material of the insulating layer is polyethylene terephthalate.

13. The display device according to claim 10, wherein material of the conductive pillar is conductive adhesive.

14. The display device according to claim 10, wherein the third flexible printed circuit board and the second flexible printed circuit board are dispose d on the same plane.

15. The display device according to claim 10, wherein the third flexible printed circuit board is disposed on the second flexible printed circuit board.

16. A manufacturing method of a signal transmission device, comprising:
disposing an insulation substrate;
disposing a connection member on the insulation substrate, and electrically connecting the connection member and a system;
disposing a first conductive pattern on the insulation substrate, and electrically connecting the first conductive pattern and the display module and the connection member;
disposing a second conductive pattern on the first conductive pattern, and electrically connecting the second conductive pattern, the display module and the first conductive pattern;
disposing a third conductive pattern on the second conductive pattern, and electrically connecting the third conductive pattern, the display module and the second conductive pattern;
disposing an insulating layers between the first conductive pattern, the second conductive pattern and the third conductive pattern, to insulating and attaching the first conductive pattern, the second conductive pattern and the third conductive pattern; and disposing an interlayer conduction structure, wherein the interlayer conduction structure comprises:

disposing through holes on the insulating layer in a vertical direction; and coating conductive layers on inner walls of the through holes;

wherein the conductive layers are electrically connected to at least one of the first conductive pattern, the second conductive pattern and the third conductive pattern, so that the second conductive pattern and the third conductive pattern are electrically connected to the system through the first conductive pattern;

wherein the second conductive pattern and the third conductive pattern are both in direct connection with the display module, and signals on the third conductive pattern are transmitted through the second conductive pattern and then the first conductive pattern via the interlayer conduction structure in order to establish communication between the display module and the system.

17. A display device, comprising:

a display module;

a system;

wherein the display module and the system are electrically connected to each other through a signal transmission device, and the signal transmission device comprises:

a first flexible printed circuit board comprising a first circuit layer and a connection member, wherein the first circuit layer is electrically connected to the display module and the system through the connection member;

a second flexible printed circuit board disposed on the first flexible printed circuit board and comprising a second circuit layer, wherein the second circuit layer is electrically connected to the display module and the first flexible printed circuit board;

a third flexible printed circuit board disposed on the first flexible printed circuit board, and comprising a third circuit layer, wherein the third flexible printed circuit board and the second flexible printed circuit board are disposed on different planes, and the third circuit layer is electrically connected to the display module and the first flexible printed circuit board;

a plurality of insulating layers made by material selected from the group consisting of polyimide, polyethylene terephthalate, polyethylene naphthalate, and disposed between the first flexible printed circuit board, the second flexible printed circuit board, and the third flexible printed circuit board, wherein the plurality of insulating layers comprise a plurality of through holes in a vertical direction; and a plurality of conductive pillars disposed in the plurality of through holes, respectively, wherein the second circuit layer and the third circuit layer are electrically connected to the system through the first circuit layer and the plurality of conductive pillars;

wherein the second circuit layer and the third circuit layer are both in direct connection with the display module, and signals on the third circuit layer are transmitted through the second circuit layer and then the first circuit layer via the plurality of conductive pillars in order to establish communication between the display module and the system.

* * * * *